(12) United States Patent
Shoa Hassani Lashidani et al.

(10) Patent No.: US 10,302,709 B2
(45) Date of Patent: May 28, 2019

(54) BATTERY STATE-OF-HEALTH DETERMINATION USING MULTI-FACTOR NORMALIZATION

(71) Applicant: Cadex Electronics Inc., Richmond (CA)

(72) Inventors: Tina Shoa Hassani Lashidani, North Vancouver (CA); Arnold Yeung, Vancouver (CA)

(73) Assignee: Cadex Electronics Inc., Richmond (CA)

( * ) Notice: Subject to any disclaimer, the term of this patent is extended or adjusted under 35 U.S.C. 154(b) by 85 days.

(21) Appl. No.: 15/364,682

(22) Filed: Nov. 30, 2016

(65) Prior Publication Data

US 2018/0149708 A1 May 31, 2018

(51) Int. Cl.
*G01R 31/392* (2019.01)
*G01R 31/367* (2019.01)

(52) U.S. Cl.
CPC ......... *G01R 31/392* (2019.01); *G01R 31/367* (2019.01)

(58) Field of Classification Search
CPC .................................................. G01B 31/392
See application file for complete search history.

(56) References Cited

U.S. PATENT DOCUMENTS

| | | | |
|---|---|---|---|
| 5,352,968 A * | 10/1994 | Reni | G01R 31/362 |
| | | | 320/136 |
| 6,215,312 B1 * | 4/2001 | Hoenig | G01R 31/2853 |
| | | | 324/427 |
| 6,441,585 B1 | 8/2002 | Bertness | |
| 6,456,988 B1 | 9/2002 | Singh et al. | |
| 6,941,234 B2 | 9/2005 | Bertness et al. | |
| 7,072,871 B1 | 7/2006 | Tinnemeyer | |
| 7,619,417 B2 | 11/2009 | Klang | |
| 8,531,158 B2 | 9/2013 | Wang et al. | |
| 9,052,366 B2 | 6/2015 | Bertness | |
| 2003/0184307 A1 | 10/2003 | Kozlowski et al. | |
| 2003/0206021 A1 | 11/2003 | Laletin et al. | |
| 2005/0218915 A1 * | 10/2005 | Tinnemeyer | G01R 27/04 |
| | | | 324/709 |
| 2007/0236225 A1 | 11/2007 | Tsenter et al. | |

(Continued)

OTHER PUBLICATIONS

JP 20140059206 (English Machine translated version) (Year: 2014).*

*Primary Examiner* — Hyun D Park
(74) *Attorney, Agent, or Firm* — Damien G. Loveland (57) ABSTRACT

A battery is subjected to a discharge current pulse that is normalized to its capacity. The battery voltage is measured before, during and after the pulse, and various parameters are calculated therefrom. The parameters are adjusted depending on both the value of the nominal or maximum cut-off voltage of the battery and on its open circuit voltage prior to the pulse. Based on the open circuit voltage, one of multiple different analysis paths is selected, each representing a different state of charge range. The analysis selected involves a comparison of the adjusted parameters with a set of thresholds that are specific to the selected analysis and that depend on the desired cut-off point between good and poor state of health. Batteries of different nominal voltages, capacities and chemistries can be tested without knowing their state of charge and without the tester having been calibrated for a specific battery model.

20 Claims, 5 Drawing Sheets (56) References Cited

U.S. PATENT DOCUMENTS

| | | |
|---|---|---|
| 2008/0024137 A1* | 1/2008 | Carlin ............... G01R 31/3631 324/427 |
| 2009/0027056 A1 | 1/2009 | Huang et al. |
| 2010/0244846 A1 | 9/2010 | Desprez et al. |
| 2011/0172939 A1 | 7/2011 | Uprety et al. |
| 2012/0310565 A1 | 12/2012 | Redey |
| 2013/0069661 A1 | 3/2013 | Rich et al. |
| 2013/0271089 A1 | 10/2013 | Yazami et al. |

* cited by examiner

BATTERY STATE-OF-HEALTH DETERMINATION USING MULTI-FACTOR NORMALIZATION

TECHNICAL FIELD

This application relates to a method and system for determining the state of health (SoH) of rechargeable batteries. In particular, it relates to the determination of the SoH using multiple normalization steps to compensate for different types of battery, different capacities and different states of charge (SoC) of the batteries.

BACKGROUND

The main challenges with battery SoH indicator methods are the different varieties of battery types and chemistries, with different rated capacities and nominal voltages. Since a battery's response to a discharge pulse used for testing is highly dependent on the above variables, existing testing methods are typically offered for only a specific battery type and model. Furthermore, a large quantity of test data for the specific model's response is pre-processed.

U.S. Pat. No. 6,441,585 to Bertness discloses a system that measures an open circuit voltage and a dynamic parameter of a test battery, and uses those measurements, along with correlation data stored in memory, to determine a physical condition and/or charge state of the battery. The measured dynamic parameter may be scaled based on the rating of the test battery. Also, a high current load pulse may be applied to the test battery and a wait period implemented before the open circuit voltage is measured. In addition, the charge state may be determined from a state of charge value, and categorized into one of several charge state ranges.

U.S. Pat. No. 7,619,417 to Klang discloses a battery monitoring system, which utilizes a minimum amount of input data (time, voltage, current, temperature and conductance, for example) to periodically determine a vehicle battery status or condition. The battery is projected to standard conditions with which it can be compared directly with the original ratings of the battery for cranking performance and capacity.

U.S. Patent Application Publication No. 2003/0184307 to Kozlowski discloses a model-based predictive diagnostic tool for primary and secondary batteries. Determining a condition parameter of a battery includes the step of obtaining condition data correlated with the condition parameter. The method includes the step of providing the condition data to a plurality of prediction algorithms, wherein each prediction algorithm provides a condition parameter estimate. The method also includes determining the condition parameter using the plurality of condition parameter estimates.

U.S. Patent Application Publication No. 2011/0172939 to Uprety discloses a system and method for determining an internal resistance, SoC, SoH and battery energy level of a rechargeable cell or battery pack. The system includes a current, voltage, and temperature sensor. The system includes a processor that is configured to read a first bulk current of the battery at a first time, and, when the first bulk current is less than a first threshold, read a second bulk current at a second time. When the second bulk current has a value between a second threshold and a third threshold and the difference between the first time and the second time is less than a pre-determined delay threshold, the processor is configured to use the first and second bulk current values to determine an internal resistance of the battery or cell.

This background information is provided to reveal information believed by the applicant to be of possible relevance to the present invention. No admission is necessarily intended, nor should be construed, that any of the preceding information constitutes prior art against the present invention.

SUMMARY OF INVENTION

The determination of the SoH of rechargeable batteries uses multiple normalization steps to compensate for different capacities, different nominal voltages of battery and different SoC of the batteries. As such, the method employs multi-dimensional normalization. The SoC does not need to be known in advance of the determination. The batteries tested may have different chemistries. Examples of different chemistries that a given embodiment of this invention applies to include Li-ion batteries such as Lithium Cobalt Oxide, Lithium Iron Phosphate, Lithium Manganese Oxide, Lithium Nickel Cobalt Aluminum Oxide, Lithium Nickel Manganese Cobalt Oxide, and Lithium Titanate. Batteries with all these battery chemistries can be measured with the same tester without the tester being aware of which specific battery chemistry is being tested. The batteries tested may also have different temperatures. As long as the battery can be discharged, its temperature can be compensated for using an empirical calculation.

The process involves applying a normalized discharge current pulse to the battery, analyzing the battery's response, normalizing the response depending on the nominal voltage or maximum cut-off voltage, normalizing the response based on the initial open circuit voltage (OCV) and analyzing the normalized response depending on which of multiple voltage regions the OCV of the battery lies in. By analyzing the normalized response depending on the initial OCV, different values of SoC can be accounted for without measuring the SoC. By taking as an input the battery capacity and nominal voltage (or maximum cut-off voltage), normalizing the discharge current pulse to the capacity and the response to the normalized voltage, batteries with different battery pack configurations can be tested for without actually knowing the configuration. The nominal or maximum cut-off voltage is generally indicative of the number of cells in series within the battery and the capacity is indicative of the number of cells in parallel. The present invention does not require pre-test battery data for each battery model in order to establish a correlation of responses to SoH.

Disclosed herein is a method for determining a state of health (SoH) of a battery, comprising: connecting the battery to a tester; receiving, in the tester, a nominal or maximum cut-off voltage of the battery; receiving, in the tester, a capacity of the battery; measuring, by the tester, an initial open circuit voltage V1 of the battery; drawing a pulse of current from the battery to the tester, said pulse having an amplitude that is normalized to the capacity; measuring, by the tester, a voltage response of the battery to the pulse; selecting, from a plurality of voltage regions, by the tester, a voltage region that V1 lies in, wherein each voltage region has an associated, different set of thresholds; adjusting, by the tester, the voltage response based on the nominal or maximum cut-off voltage and based on the selected region; comparing, by the tester, said adjusted response to at least one of the thresholds associated with the selected region; and determining, by the tester and based on said comparison, whether the SoH is above or below a predefined cut-off value.

In some embodiments, the voltage response is processed into a plurality of parameters; the voltage response is adjusted by adjusting the parameters; and said comparison is performed by comparing the adjusted parameters to said at least one threshold. In some embodiments, the parameters comprise: a first parameter P1 defined by subtracting from V1 a voltage V4 measured at the end of a recovery period that follows the pulse; a second parameter P2 defined by subtracting a voltage V3 measured at the beginning of the recovery period from a voltage V2 measured at the end of the pulse; and a third parameter P3 defined by subtracting V2 from V1.

In some embodiments, the SoH is good if the SoH is above the cut-off value and poor if the SoH is below the cut-off value; and there are three regions. If V1 is above a first value, a first region is selected; if V2 is not above the first value but V2 is above a second value, a second region is selected; if V2 is not above the second value, the third region is selected. If the first region is selected: if P1 is below a first threshold, the SoH is good; if P1 is above a second threshold that is higher than the first threshold, the SoH is poor; and if P1 is between the first and second thresholds, then if P2 is greater than a third threshold and P3 is less than a fourth threshold, the SoH is good, otherwise the SoH is poor. If the second region is selected: if P3 is less than a fifth threshold, the SoH is good; if P3 is greater than a sixth threshold that is greater than the fifth threshold, the SoH is poor; and if P3 is between the fifth and sixth thresholds and P2 is greater than a seventh threshold, then the SoH is good, otherwise the SoH is poor. If the third region is selected: if P3 is less than a eighth threshold, the SoH is good; if P3 is greater than a ninth threshold that is greater than the eight threshold, the SoH is poor; and if P3 is between the eight and ninth thresholds and P2 is greater than a tenth threshold, then the SoH is good, otherwise the SoH is poor.

In some embodiments, the pulse is followed by a recovery period during which no current is drawn from the battery and the voltage response is measured, and which has a duration long enough for a rate of change of the voltage response to fall below 0.1 mV/s.

Also disclosed herein is a device for determining state of health (SoH) of a battery, comprising: a connection to a battery to be tested; a user interface configured to receive a nominal or maximum cut-off voltage of the battery and a capacity of the battery; a voltage sensor to detect an initial open circuit voltage V1 of the battery; a load configured to draw a pulse of current from the battery, said pulse having an amplitude that is normalized to the capacity; and a processor configured to: obtain a voltage response of the battery to the pulse; select, from a plurality of voltage regions, a voltage region that V1 lies in, wherein each voltage region has an associated, different set of thresholds; adjust the voltage response based on the nominal or maximum cut-off voltage and based on the selected region; compare said adjusted response to at least one of the thresholds associated with the selected region; and determine, based on said comparison, whether the SoH is above or below a predefined cut-off value.

BRIEF DESCRIPTION OF DRAWINGS

The following drawings illustrate embodiments of the invention, which should not be construed as restricting the scope of the invention in any way.

DESCRIPTION

A. Glossary

The term "capacity" or "C" refers to the rated maximum charge that a battery can hold when it is new. Capacity is measured in Coulombs, Ah or mAh.

The term "module" can refer to any component in this invention and to any or all of the features of the invention without limitation. A module may be a software, firmware or hardware module.

The term "nominal voltage" refers to the mid-point between the voltage when fully charged and the voltage when fully discharged based on a discharge rate of 0.2 C per hour, where C is the rated capacity of the cell. The term "nominal voltage" may also be referred to as the voltage rating of the battery, or simply the voltage of the battery.

The term "maximum cut-off voltage" refers to the OCV when the battery is fully charged. A battery should not be charged to a voltage higher than its maximum cut-off voltage.

The term "open circuit voltage" (OCV) refers to the voltage across the terminals of a battery without any current being drawn from the battery. Typically, as the SoC of a battery declines, its OCV falls. Also, as a battery's SoH deteriorates, the maximum OCV to which the battery can be charged declines.

The term "processor" is used to refer to any electronic circuit or group of circuits that perform calculations, and may include, for example, single or multicore processors, multiple processors, an ASIC (Application Specific Integrated Circuit), and dedicated circuits implemented, for example, on a reconfigurable device such as an FPGA (Field Programmable Gate Array). The processor performs the steps in the flowcharts, whether they are explicitly described as being executed by the processor or whether the execution thereby is implicit due to the steps being described as performed by code or a module.

The term "recovery period" or "rest period" refers to a duration of time after which a current pulse has been discharged from a battery. During the recovery period, no current is drawn from the battery, i.e. substantially no current is drawn from the battery.

The term "state of charge" (SoC) is a percentage that refers to the amount of charge available in a rechargeable battery. Typically, the SoC is measured as a percentage, with 100% being fully charged and 0% being either fully discharged to a minimum cut-off voltage or discharged to the point beyond which damage may occur.

The term "state of health" (SoH) is a percentage that refers to the maximum amount of charge a rechargeable battery can presently hold compared to its rated charge, or its maximum charge when new. As the battery ages, and as it is cycled through discharge and charge cycles, the SoH falls. Eventually, the SoH drops so low that the battery becomes unfit for its purpose.

The term "system" when used herein refers to a system for determining the SoH of rechargeable batteries, the system being a subject of the present invention. The output of the system is whether the SoH is good or poor.

B. Industrial Applicability

The present invention is useful for sorting rechargeable batteries into those that have a good SoH and those that have a poor SoH, without each specific battery or model of battery having been tested beforehand. The method and system of the present invention can be used to determine the SoH of batteries with different nominal voltages, different states of charge and different nominal capacities.

C. Voltage Response

Figure 1:
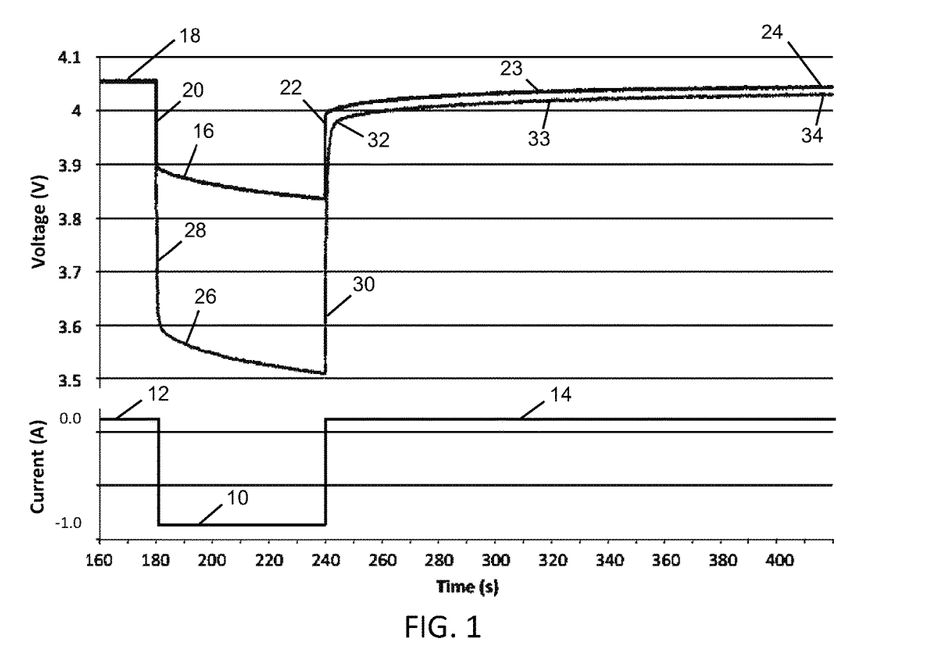
FIG. 1 is a graph showing a current pulse drawn from a battery and corresponding voltage responses of batteries with two different states of health.

Referring to FIG. 1, an example of a discharge current pulse 10 that is used in the present invention is shown. The discharge current pulse 10 is a square pulse that starts from a value of zero amps 12, has a magnitude of 1.0 A and a duration of 60 s, and terminates at a value of zero amps 14. The current pulse 10 on the graph has a negative value because it is a discharge current rather than a charging current, according to convention.

Corresponding to the current pulse 10, a trace of the voltage response 16 of a battery with a good SoH (98%) is shown. The trace starts with the voltage 18 at the OCV level for the battery. At the moment that the discharge pulse 10 is applied, the voltage of the battery falls rapidly 20 to about 3.9V, after which it continues to fall gradually throughout the duration of the discharge pulse 10. When the discharge pulse terminates, the voltage rises rapidly 22 at first and then more gradually 23 to voltage level 24.

Also corresponding to the current pulse 10, a trace of the voltage response 26 of a battery with a deteriorated SoH (72%) is shown. The trace starts with the voltage 18 at the OCV level for the battery. At the moment that the discharge pulse 10 is applied, the voltage of the battery falls rapidly 28 to about 3.6V, after which it continues to fall gradually throughout the duration of the discharge pulse 10. When the discharge pulse terminates, the voltage rises rapidly 30 at first and then more gradually 33 to voltage level 34. Note that the transition 32 from the rapid rise 30 to the more gradual rise 33 is less abrupt than for the voltage trace 16 for the battery with the better SoH. Also, the end voltage 24 of trace 16 of the good battery after resting is higher than the end voltage 34 of the poor battery, showing that a poor battery loses more of its OCV than a good battery in response to the same discharge pulse.

Besides the lower voltages being different for the traces 16, 26 and the transition region 32 being different, other differences in the voltage traces may occur for different batteries in different states of health, such as a different recovery voltage level 24, a different rate of recovery of voltage at point 23, different discharge slopes during the pulse 10, and different voltage declines during the pulse. Also, the SoC will affect the shape of the voltage response.

Figure 2:
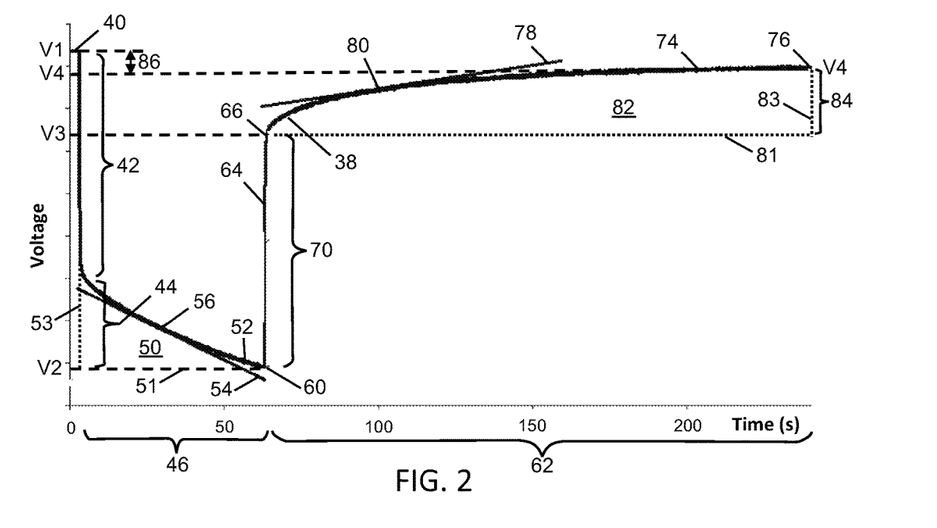
FIG. 2 is a graph of a voltage response with key voltage measurement points shown.

FIG. 2 shows the anatomy of a voltage response 38 in more detail. The voltage V1 at point 40 is the initial OCV of a battery prior to it being subject to a 60 s current discharge pulse. At the moment that the discharge pulse is applied, the battery undergoes a "discharge voltage fall" 42 as the voltage across its terminals rapidly falls. Following the initial discharge voltage fall 42, the battery undergoes a further voltage decline 44 during, and as a result of, the continued drawing of current from the battery. At the end of the discharge, which has a duration 46, the voltage of the battery has fallen to voltage V2. The discharge area 50 is bounded by the curve 52 of the voltage response during the discharge 46, the voltage V2 represented by a dashed line 51, and the start of the discharge represented by a dotted line 53. The slope 54 of the curve 52 may be measured at point 56 of the response or at any other point occurring within the duration of the discharge 46.

At point 60, which corresponds to the minimum voltage V2 and the end of the discharge pulse 46, a recovery period 62 starts, during which there is no current drawn from the battery and during which the OCV of the battery recovers. At the moment that the discharge terminates, the voltage rises rapidly 64 to voltage V3 at point 66 as the battery undergoes a recovery voltage jump 70. From point 66 the voltage recovers further and more gradually 74 until it reaches voltage V4 at point 76, at the end of the recovery period 62. Note that in this example the recovery period is 180 s long, but other durations of the recovery period may be used in other embodiments. After the recovery period as shown, the voltage of the battery may still rise further, but this further rise does not need to be accounted for in the present invention. The rest slope 78 at point 80 of the response 38 may be calculated as the rate of rise of voltage in the recovery period 62, and it may also be calculated at any other point in the recovery period. The rest area 82 is the area that is bounded by the voltage trace in the recovery period 62 and the dotted lines 81, 83. During the recovery period 62, the voltage rises by voltage gain 84, more slowly than it rises in the recovery voltage jump 70. The voltage V4 at the end of the recovery period 62 is lower than the voltage V1 before the start of the discharge pulse, by an amount defined as the voltage loss 86.

Various parameters are defined in relation to the response 38, which are used for determining the SoH of a battery. The first parameter Prm1 is defined as the voltage loss 86:

Prm1=V1−V4

The second parameter Prm2 is defined as the negative of the recovery voltage jump 70:

Prm2=V2−V3

The third parameter Prm3 is defined as the sum of the discharge voltage fall 42 and the ensuing voltage decline 44:

Prm3=V1−V2

The use of these parameters will be described below with reference to the flowcharts. The parameters may also be referred to as P1, P2 and P3 respectively.

D. Exemplary System

Figure 3:
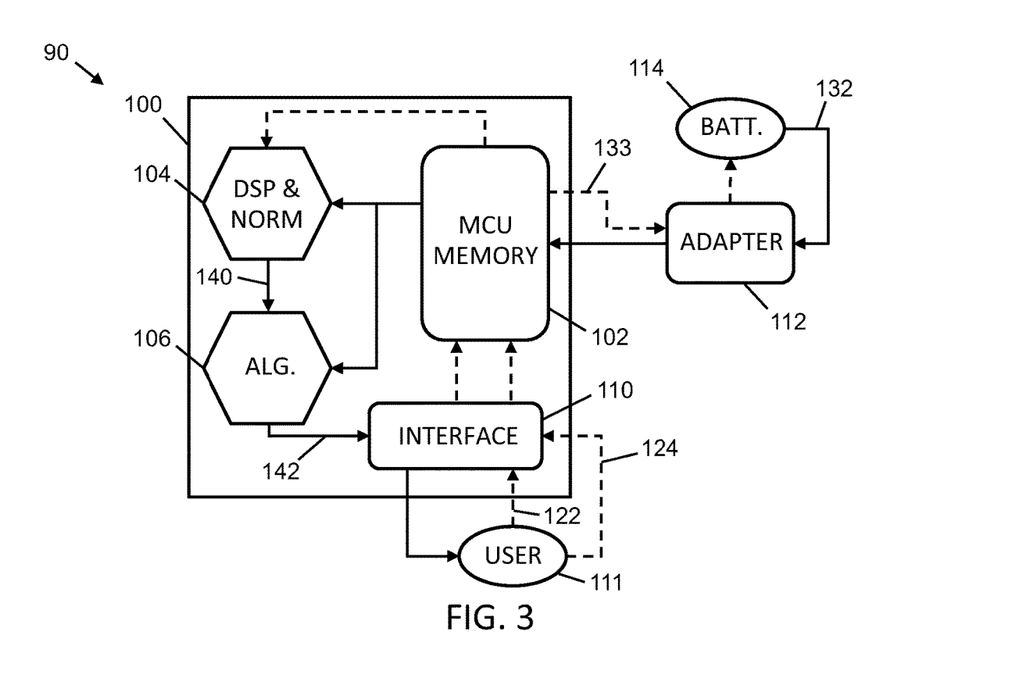
FIG. 3 is a schematic block diagram of a system for determining the SoH of a battery according to an embodiment of the present invention.

Referring to FIG. 3, an exemplary system 90 for determining the SoH of batteries is shown. The system 90 includes a tester 100, which in turn includes a combined micro-controller unit (MCU) and memory 102. The MCU has one or more processors for processing computer readable instructions and reading computer readable data that are stored in the memory or are otherwise accessible to the MCU. Code modules 104 within the tester 100 perform digital signal processing (DSP), normalization and adjustment of parameters. Further code module 106 includes an algorithm comprising multiple analysis paths each of which compare compensated parameters with various different thresholds in order to determine whether the battery from which the parameters were obtained is in a good or a poor SoH. The tester 100 also includes a user interface 110, which may include one or more buttons via which commands can be sent from a user 111 to the system 90. The interface 110 also includes one or more display lights, such as light-emitting diodes, for displaying the status of the tester 100 to the user 111. Also in the interface 110 is a display screen, such as a 2×20 LCD character display, for presenting information and notifications to the user.

Connected to the tester 100 is an adapter 112, to which a battery 114 can be connected for testing. Different types of adapter 112 can be connected to the tester to suit different types of battery. The connection may be made, for example, via an SPI (Serial Peripheral Interface) port on the tester 100. In other embodiments of the tester 100 there are further ports, such as a USB (Universal Serial Bus) port for connection to a computer or other remote interface, and a serial port for connection to a computer or printer. If remote devices are connected to the tester 100 for its control and/or analysis of the measurements made by the tester, the remote devices are considered to be part of the tester.

The tester 100 receives data, from the user 111, through the user interface 110 regarding the capacity 122 of a battery 114 that is attached to the adapter 112. The capacity 122 is used to normalize the magnitude of the discharge current pulse to the value of the capacity. The process of normalization is performed by the MCU 102, under the control of the normalization module 104. For example, a battery with a capacity of 2000 mAh is tested with a 1.00 A discharge current pulse. Other batteries are tested with pulses that are linearly normalized to this, such that a 3000 mAh battery is tested with a 1.50 A pulse and a 1000 mAh battery is tested with an 0.50 A current pulse. In each case, the duration of the current pulses is 60 s. This duration can be shortened or lengthened depending on the particular embodiment that is used. As a result of this normalization of the pulse magnitude to the battery capacity, batteries with different capacities can be tested with the tester 100.

The tester 100 also receives data, from the user 111, through the user interface 110 regarding the nominal voltage 124 of the battery 114. The value of the nominal voltage is used to convert the calculated parameters that result from the testing of the battery to equivalent parameters that would have been obtained had the battery had a nominal voltage of 3.6 V. If the value of the "maximum cut-off voltage" is inputted instead of the nominal voltage, then its value is used to convert the calculated parameters that result from the testing of the battery to equivalent parameters that would have been obtained had the battery had a maximum cut-off voltage of 4.2V. The conversion factors represent a non-linear compensation that has been arrived at empirically. The result is that the tester 100 effectively normalizes the measured parameters as if they came from batteries with the same nominal voltage. The process of normalization is performed by the MCU 102, under the control of the normalization module 104. As a result, batteries with nominal voltages of 3.6V, 3.7V, 3.8V and 3.85V or maximum cut-off voltages of 4.2V, 4.3V, 4.35V and 4.4V, for example, which are common voltages for cellphone batteries, may all be tested with the same tester. As not all batteries are labeled with the maximum cut-off voltage, the nominal voltage is used instead, since it is always written on the battery. If necessary, the tester 100 internally converts between the nominal voltage and the maximum cut-off voltage.

The system 90 measures the initial OCV of the battery 114 via response line 132, which is directed to the MCU 102. The MCU includes a voltage sensor for measuring voltages on the battery. The MCU applies an excitation current pulse via line 133 into the battery 114, by applying a load to the battery such that current is drawn from it. The voltage of the battery 114 is then measured over a period of time to obtain the voltage response, both during the current pulse and during a recovery period that immediately follows the pulse. The voltage response is stored in the MCU memory 102 and processed by the DSP and normalization modules 104. The normalized parameters are passed 140 from the DSP and normalization modules 104 to the algorithm module 106 in order to determine the SoH of the battery, which is passed along line 142 to the interface 110.

E. Processes

Figure 4:
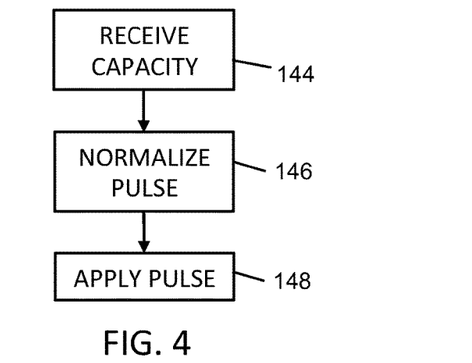
FIG. 4 is a flowchart of the normalization process for applying a discharge pulse to a battery, according to an embodiment of the present invention.

Referring to FIG. 4, a process is shown that is performed by the system 90 to determine the magnitude of the pulse to be applied to the battery 114. In step 144, the system 90 receives the value of the battery capacity from a user. Typically, the capacity of a battery is printed on a label on the battery. In step 146, the system 90 calculates a normalized pulse to apply to the battery 114, by scaling the magnitude of a standard pulse in proportion to the rated capacity of the battery to be tested. Assuming the battery were a new battery with a 100% SoH, it would be completely discharged after a known amount of time (in this example 2 hours) if the discharge amplitude were to be continuously applied for that amount of time, irrespectively of the rated capacity of the battery. By normalizing the magnitude of the pulse in this way, each battery under test experiences the same power loss relative to its rated capacity. However, if the pulse were of a fixed, predetermined amplitude and not normalized, a smaller capacity battery would be depleted faster than a larger capacity battery. The magnitude or amplitude of the current $I_T$ for testing is given as follows: $C_T$ is the rated capacity in Ah of the battery to be tested and N is the normalization factor that in theory could be any number (typically from 0.1 to 20) that results in a measurable voltage response without depleting the battery beyond its safe recommended level (here N was chosen to be 2 h):

$$I_T = (C_T/N)$$

After the normalized pulse has been calculated, the battery tester 100 excites the battery 114, in step 148, with a square wave discharge pulse for a period of time with an amplitude that is normalized as above. A rest period during which no current is discharged from the battery follows for a period of time after the pulse.

Figure 5:
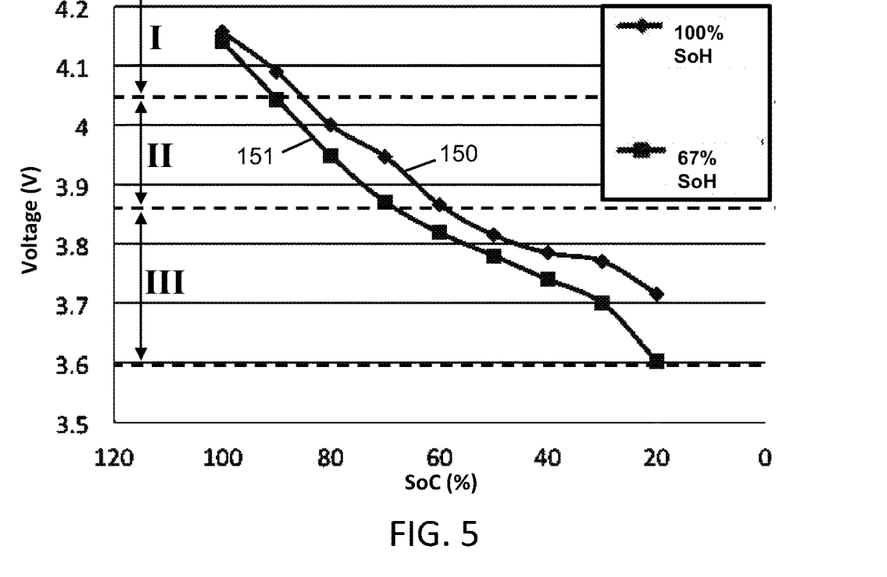
FIG. 5 is a graph showing the variation of open circuit voltage (OCV) of a battery with SoC, for two different states of health.

It is not normally possible to determine the SoH from a simple OCV measurement, as is evidenced by referring to FIG. 5. This graph shows the variation in OCV with SoC for two batteries: one with a SoH of 100%, shown by line 150; and the other with a SoH of 67%, shown by line 151. For example, an OCV of 3.9V could represent a battery with 100% SoH (good) and 65% SoC, or a battery with 67% SoH (poor) and 75% SoC. However, the inventors have found that by measuring voltages at various points in a response of a battery to a discharge current pulse, calculating normalized parameters based on these and comparing them to a set of predefined thresholds that depend on the OCV V1, the SoH of a battery can be determined without knowing the SoC. As one of the steps to achieve this, the system 90 is programmed to place the initial OCV V1 of the battery, without normalization, into one of three voltage regions. Each voltage region approximately represents a different section of the SoC curve for a range of different SoH values. As can be seen in FIG. 5, region I is from 4.05V to the maximum voltage of the battery, irrespective of whether the battery has a maximum cut-off voltage of 4.2V, 4.3V, 4.35V or 4.4V. Region II is from 3.87V to 4.04V, and region III is from 3.60V to 3.86V. If the measured V1 is below 3.60V, it is considered to be fully discharged and must be recharged before testing. Regions I, II and III correspond approximately to high, medium and low SoC values. A finer division of the SoC regions may be applied in other embodiments. The voltage response 38 is different in each of the three regions, and different calculations and comparisons are needed in each of the regions. In region I, the SoH is calculated by taking into account all parameters Prm1, Prm2 and Prm3, whereas in region II and region III, only Prm2 and Prm 3 are used.

Figure 6:
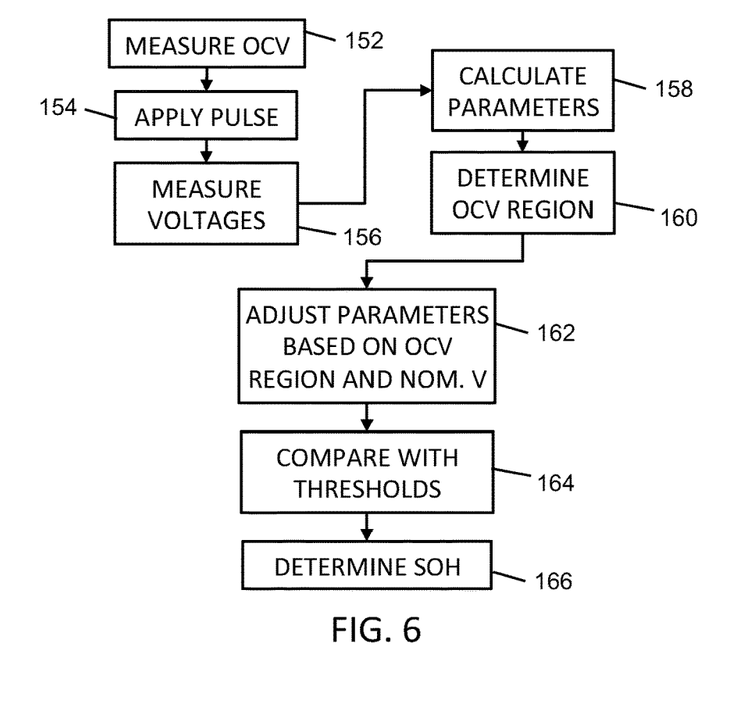
FIG. 6 is a simplified flowchart of the process for determining the SoH of a battery, according to an embodiment of the present invention.

Referring to FIG. 6, the placement of the measured values of V1 into three different regions is taken into account in a simplified flowchart of an exemplary process that the system 90 performs to determine the SoH of batteries. In step 152, the OCV V1 is measured without any current being drawn from the battery under test. In step 154, a normalized current pulse is discharged from the battery. During the current pulse and after it has ended, the voltage response of the battery is measured, in step 156. In particular, voltages V1, V2, V3 and V4 are measured. In step 158, the parameters Prm1, Prm2 and Prm3 are calculated using the values of voltage V1, V2, V3 and V4. In step 160, the voltage region is determined from the measured value of voltage V1. Depending on which region V1 lies in and on the nominal voltage of the battery, the parameters are adjusted, in step 162, such that they are normalized for a standard region and to a standard battery. In step 164, the normalized parameters are compared with various thresholds to allow the determination, in step 166, of whether the SoH is above or below a predetermined level, i.e. whether the SoH is good or poor respectively.

Figure 7:
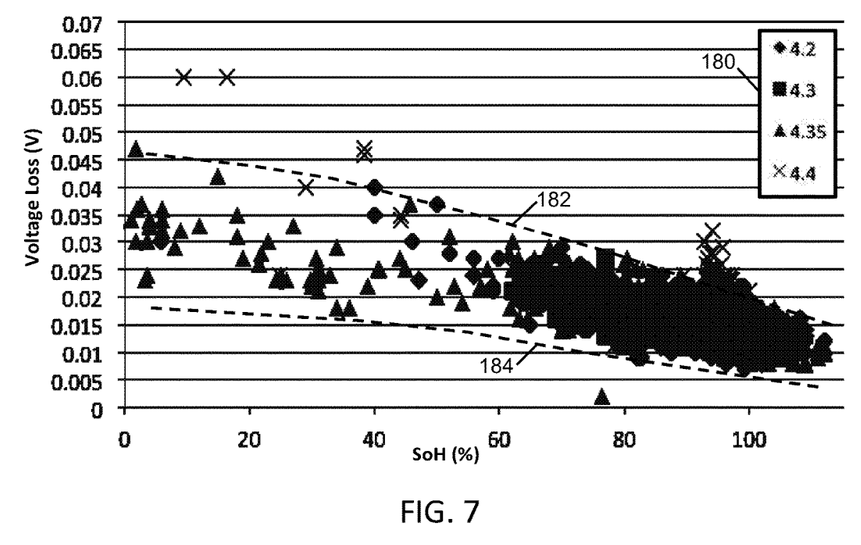
FIG. 7 is a plot of the voltage loss parameter of multiple batteries vs. SoH before compensation for different nominal voltages of the batteries.
Figure 8:
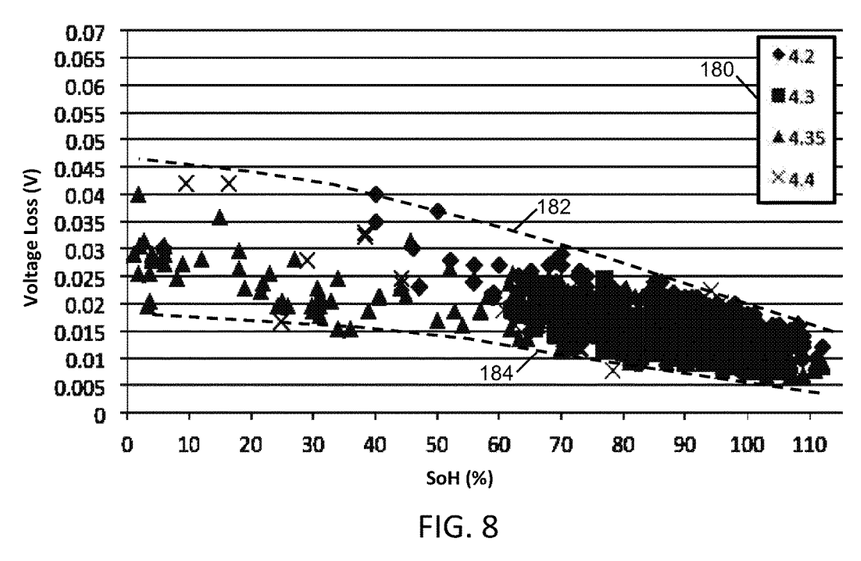
FIG. 8 is a plot of the voltage loss parameter of the batteries of FIG. 7 after compensation for different nominal voltages, according to an embodiment of the present invention.

FIG. 7 shows the voltage loss parameter Prm1 for numerous batteries that have been subject to the normalized current discharge pulse. The values of Prm1 are plotted against known values of SoH for the batteries. In this graph the parameter Prm 1 has not been normalized with respect to the maximum cut-off voltage of the batteries. The legend 180 shows that batteries with 4.2V, 4.3V, 4.35V and 4.4V maximum cut-off voltages were used. The dashed lines 182, 184 are shown for reference only, to indicate that some of the values of Prm1 are clearly outside the lines. FIG. 8 shows the same parameters after normalization with respect to the maximum cut-off voltages of the batteries. It can be seen that many of the points that were outside of the dashed lines 182, 184 are now within them, and therefore that the normalization has resulted in a clearer relationship between the SoH and Prm1. The other parameters Prm2 and Prm3, when plotted against known SoH values, show similar improvements after the normalization process.

Figure 9:
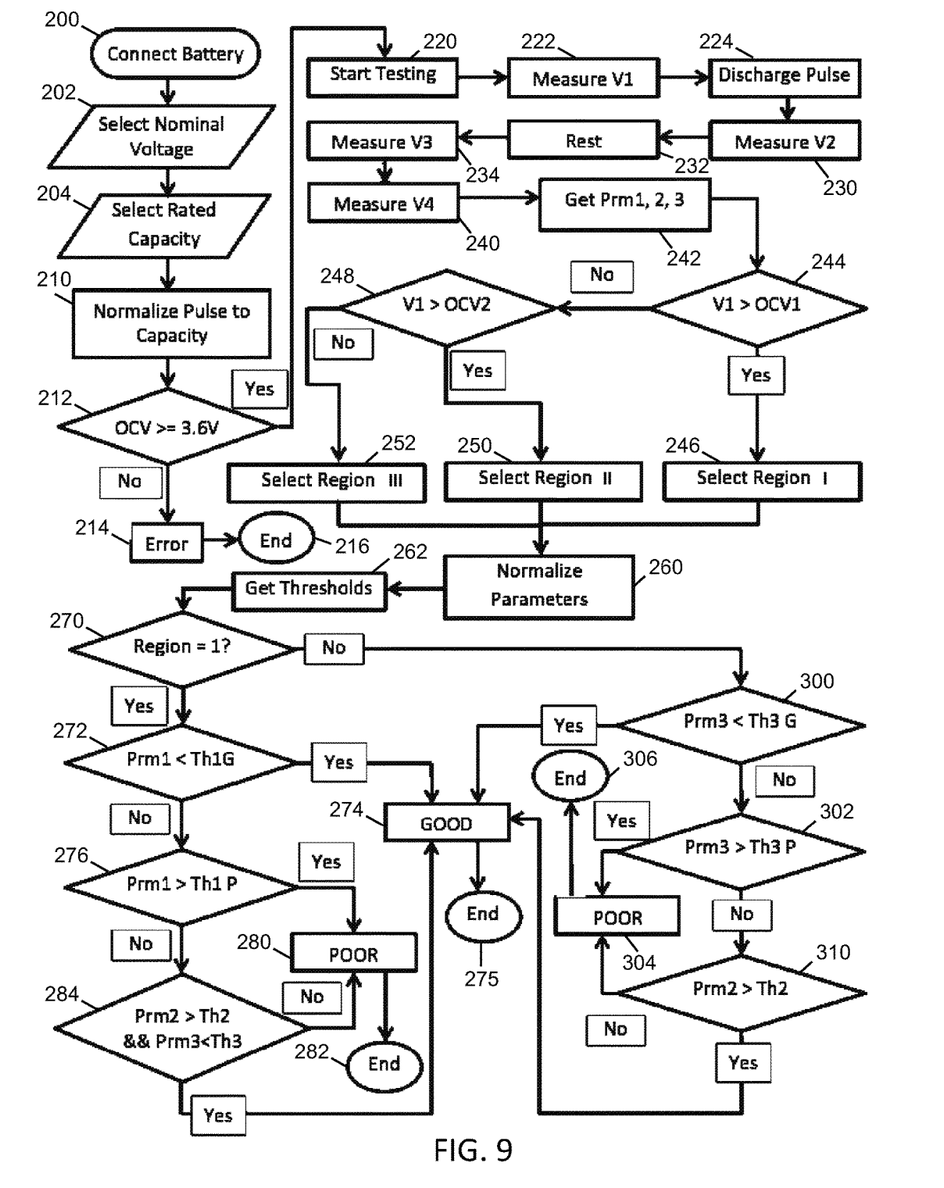
FIG. 9 is a detailed flowchart of a process for determining the SoH of a battery, according to an embodiment of the present invention.

Referring to FIG. 9, a detailed flowchart of the process performed by the system 90 is shown. In step 200, a battery to be tested is connected to the system 90. In step 202, the system 90 receives an input from a user that specifies the nominal or max cut-off voltage of the battery. In step 204, the system 90 receives an input from a user that specifies the rated capacity of the battery. In step 210, the system calculates a normalized value for the magnitude of the discharge current pulse, which is normalized to the rated capacity. In step 212, the system determines whether the initial OCV V1 is at least 3.6V. If V1 is below 3.6V, then the system reports an error in step 214, and the process ends in step 216. Provided that the nominal voltage of the battery is within the range that is testable by the system, the error that is reported via the user interface 110 indicates that the battery should be charged before testing. The system prompts the user to charge the battery. If the battery had just been recharged then the error would imply that the battery is dead.

Returning to step 212, if V1 is equal to or greater than 3.6V, then the system 90 starts the testing process in step 220. In step 222, the system determines an actual value of V1. While V1 may already have been obtained in step 212, in this embodiment it is obtained in the last second before the following step 224. In step 224, the system applies the normalized discharge current pulse to the battery, which has a duration of 60 s. At the end of the current pulse, or just before the end of the current pulse, the system measures the lowest voltage V2 that the battery reaches, in step 230. In practice, V2 is measured in the last second of the current pulse. After the current pulse, the system rests the battery in step 232, during which period no current (i.e. substantially no current) is drawn from the battery. Immediately after the end of the current pulse and during the initial moment of the recovery period, the system measures V3, in step 234. In practice, V3 is measured in the first second of the recovery period. At the end of the recovery period, which has a duration of 180 s, the system measures V4, in step 240. In practice, V4 is measured in the last second of the recovery period. After the voltages V1, V2, V3 and V4 have been measured, the system calculates the parameters Prm1, Prm2 and Prm3, in step 242.

The next part of the process determines which voltage region V1 lies in. In step 244, the system determines whether V1 is greater than OCV1, which in this embodiment is 4.04V. If V1 is greater than OCV1 then the system, in step 246, selects region I for its calculations. If, in step 244, V1 is equal to or lower than OCV1, then the process moves to step 248, in which the system determines whether V1 is greater than OCV2, which in this embodiment is 3.86V. If V1 is greater than OCV2 then the system, in step 250, selects region II for its calculations. If, in step 248, V1 is equal to or lower than OCV2, then the process moves to step 252, in which the system selects region III for its calculations. After the selection of the voltage region, the system proceeds to normalize the parameters Prm1, Prm2 and Prm3 to the maximum cut-off voltage and to the region selected, in step 260. Normalization to both the maximum cut-off voltage and the region is done in a single step that involves multiplying the parameters by factors given in Table 1.

TABLE 1

| Region | Max. cut-off voltage/V | Factor Prm1 | Prm2 | Prm2 |
| --- | --- | --- | --- | --- |
| I | 4.2 | 1 | 1 | 1 |
| | 4.3 | 0.8 | 0.9 | 0.9 |
| | 4.35 | 0.85 | 0.85 | 0.85 |
| | 4.4 | 0.69 | 0.7 | 0.7 |
| II | 4.2 | 1 | 1 | 1 |
| | 4.3 | 0.9 | 0.9 | 0.95 |
| | 4.35 | 0.9 | 0.9 | 0.95 |
| | 4.4 | 0.7 | 0.7 | 0.55 |
| III | 4.2 | 1 | 1 | 1 |
| | 4.3 | 1 | 1 | 0.94 |

TABLE 1-continued

| Region | Max. cut-off voltage/V | Prm1 | Factor Prm2 | Prm2 |
|---|---|---|---|---|
| | 4.35 | 1 | 0.9 | 0.95 |
| | 4.4 | 0.9 | 0.7 | 0.7 |

In step 262, the system obtains the thresholds that the parameters are to be compared with. Depending on the cut-off value of the SoH that is chosen to divide good batteries from poor ones, the thresholds are different. In situations where the performance of the battery is critical, then a higher SoH cut-off value will be chosen than for other, less demanding situations. The cut-off value may either be selected by the user providing an input to the interface 110, or it may be predefined in the memory of the tester 100. The thresholds are stored in the system according to Table 2.

TABLE 2

| Region | SoH cut-off % | Th1G (good) | Th1P (poor) | Th2 | Th3 | Th3G (good) | Th3P (poor) |
|---|---|---|---|---|---|---|---|
| I | 60 | 0.0162 | 0.0210 | −0.160 | 0.319 | | |
| | 70 | 0.0162 | 0.0192 | −0.150 | 0.264 | | |
| | 80 | 0.0125 | 0.0160 | −0.148 | 0.260 | | |
| | 90 | 0.0119 | 0.0140 | −0.144 | 0.251 | | |
| II | 60 | | | −0.151 | | 0.317 | 0.408 |
| | 70 | | | −0.132 | | 0.310 | 0.357 |
| | 80 | | | −0.126 | | 0.258 | 0.273 |
| | 90 | | | −0.116 | | 0.245 | 0.258 |
| III | 60 | | | −0.161 | | 0.286 | 0.380 |
| | 70 | | | −0.150 | | 0.284 | 0.353 |
| | 80 | | | −0.146 | | 0.238 | 0.300 |
| | 90 | | | −0.109 | | 0.223 | 0.270 |

Once the relevant thresholds have been obtained, the normalized parameters are compared with them. In step 270, the system determines, in step 272, whether region I has been selected. If region I has been selected, the system determines whether Prm1<Th1G, i.e. whether the voltage loss 86 is below a certain amount. If Prm1<Th1G, then the system determines the battery to have a good SoH in step 274 and outputs this to the user interface 110. The process then ends in step 275. If Prm1≥Th1G, i.e. the voltage loss 86 is above the certain amount mentioned above, then the process proceeds to step 276 in which the system determines whether Prm1>Th1P, i.e. whether the voltage loss 86 is too high. If Prm1>Th1P, then the system determines that the battery has a poor SoH in step 280 and outputs this to the user interface. The process then ends in step 282. Returning to step 276, if Prm1≤Th1P, meaning that the voltage loss 86 is within a borderline range where the SoH could be good or poor, then the other two parameters are tested. This is done in step 284, where if Prm2>Th2 and Prm3<Th3, then the battery is determined to be in a good SoH in step 274, after which the process ends in step 275. The conditions of step 284, if true, translate to both the total voltage drop due to the pulse and the voltage rise at the start of the recovery period both being below a respective magnitude. If either of the conditions Prm2>Th2 and Prm3<Th3 is not true, then the battery is determined to have a poor SoH in step 280, after which the process ends in step 282.

Returning to step 270, if it is determined that region I was not selected, then the system tests whether Prm3<Th3G in step 300. If Prm3<Th3G, then the battery is determined to have a good SoH in step 274, which is presented on the user interface. This corresponds to the total voltage fall due to the pulse being less than a certain magnitude. The process then ends in step 275. If, in step 300, Prm3≥Th3G then the system tests whether Prm3>Th3P in step 302. If Prm3>Th3P, then the system determines the battery to have a poor SoH in step 304, which is presented on the interface. This corresponds to the battery having too great a total drop in voltage due to the application of the pulse. After this, the process ends in step 306. If, in step 302, Prm3≤Th3P, then the process moves to step 310 in which the system determines whether Prm2>Th2. If Prm2>Th2, then the battery is determined to have a good SoH in step 274, which corresponds to the voltage recovery jump 70 having a magnitude below a certain limit. After this, the process ends in step 275. If, in step 310, the system determines that Prm2≤Th2, then the battery is determined to have a poor SoH in step 304, which means that the magnitude of the voltage recovery jump is too great. After this, the process ends in step 306.

As can be seen from the flowchart of FIG. 9, region I uses a different set of tests for determining the SoH than regions II and III. Regions II and III use the same series of tests but with different thresholds. In region I, all three parameters are used, but in regions II and III, only the two parameters Prm2 and Prm3 are used.

F. Variations

The present embodiment is of the best presently contemplated mode of carrying out the subject matter disclosed and claimed herein, however, other embodiments are possible.

For example, in other embodiments within the purview of the present invention, the applied discharge current pulse may be other than a square pulse. For example, the applied current may be a dynamic signal, such as a sine wave or a series or combination of sine waves at different frequencies. In other cases, the discharge pulse may reduce in magnitude in a stepped fashion throughout the duration of the pulse.

Besides the voltage points and parameters relating to the voltage response 38 in FIG. 2, other voltage points and parameters may also be defined and used in calculations for determining the SoH of batteries. Normalization factors may be linear or non-linear.

While the adapter 112 is predominantly for electrical connection to the battery 114, it also may be used to store some information about the battery if needed. The adapter 114 may be part of the tester 100 in other embodiments.

The number of regions that the initial OCV V1 can be placed into may be different than three in other embodiments. For example, the number of regions may be two, four, five or more.

In other embodiments it is envisaged that the battery itself can provide its nominal voltage to the system 90 in step 202 of FIG. 9, or the system can read the nominal voltage from data stored in a memory that forms part of the battery. The same applies to the maximum cut-off voltage.

Further normalization factors may be applied to the voltages measured and the calculated parameters in order to compensate for different temperatures of the batteries. For example, a temperature sensor is embedded in the adaptor that touches the surface of the battery under test. The normalization with respect to temperature is empirical and based on preprocessed data. Different batteries have different operating temperatures. For example, there are some Li-ion batteries that can be discharged at −30° C., and on the high side there is also some variation in operating temperature. As long as the battery can be discharged, its temperature can be compensated for. Compensation may be achieved by further adjustment of the normalized parameters and/or by varying one or more of the thresholds as a function of temperature.

In other embodiments, the method may include applying a small signal excitation to the battery, such as a sine wave; measuring the voltage response of the battery; extracting electrochemical parameters such as ohmic resistances, charge transfer RC elements, double layer capacitors and diffusion related impedances of the battery in the frequency domain; obtaining at least one parameter relating to a change in the battery resistive response; obtaining at least one parameter relating to a change in the battery reactive response; normalizing the parameters to the battery rated capacity; normalizing the parameters to the battery voltage and capacity properties (such as nominal voltage and rated capacity); normalizing the parameters to the battery SoC; normalizing the parameters to the battery temperature; and computing a measure of a condition of the battery, such as the SoH, based at least in part on the at least one normalized parameter.

The normalized parameters may be supplied as inputs to other evaluation programs or systems such as a neural network, a fuzzy logic inference engine or the like.

The duration of the current pulse has been selected to be 60 s so that the batteries lose enough voltage during the pulse to be measured with the available resolution of the hardware that has been used. Hardware with a finer measuring resolution may be used, in which case it will be possible to use current pulses with a shorter duration and/or a lower amplitude. Likewise, in other embodiments, pulses with longer durations may also be used. Similarly, the duration of the recovery period has been selected to be 3 minutes because it gives enough time for an useful or accurate enough voltage loss measurement and because it is generally not very convenient for the user for the test to last much longer. Other durations of the recovery period can be used in other embodiments, both longer and shorter. For example, in some embodiments, the recovery period could be defined such that for the majority (e.g. 99%) of batteries being tested, the rate of change of voltage at the end of the recovery period falls below 0.1 mV/s.

The parameters, thresholds and normalization factors may be extended to cover regions of SoH that are outside of the 60%-90% values used herein.

In another embodiment, different types of lead acid batteries, such as Flooded, Gel Cell and Absorbent Glass Mat can be tested by a single tester, without providing information about the specific chemistry to the tester. However, if Li-ion and lead acid batteries were to be tested by the same tester, then the particular family of battery chemistry would need to be inputted in the tester, or otherwise made known to it, as the thresholds used by the tester for the various calculations would be different.

In general, unless otherwise indicated, singular elements may be in the plural and vice versa with no loss of generality. The use of the masculine can refer to masculine, feminine or both.

Throughout the description, specific details have been set forth in order to provide a more thorough understanding of the invention. However, the invention may be practiced without these particulars. In other instances, well known elements have not been shown or described in detail and repetitions of steps and features have been omitted to avoid unnecessarily obscuring the invention. Accordingly, the specification and drawings are to be regarded in an illustrative, rather than a restrictive, sense.

The detailed description has been presented partly in terms of methods or processes, symbolic representations of operations, functionalities and features of the invention. These method descriptions and representations are the means used by those skilled in the art to most effectively convey the substance of their work to others skilled in the art. A software implemented method or process is here, and generally, understood to be a self-consistent sequence of steps leading to a desired result. These steps require physical manipulations of physical quantities. Often, but not necessarily, these quantities take the form of electrical or magnetic signals or values capable of being stored, transferred, combined, compared, and otherwise manipulated. It will be further appreciated that the line between hardware and software is not always sharp, it being understood by those skilled in the art that the software implemented processes described herein may be embodied in hardware, firmware, software, or any combination thereof. Such processes may be controlled by coded instructions such as microcode and/or by stored programming instructions in one or more tangible or non-transient media readable by a computer or processor. The code modules may be stored in any computer storage system or device, such as hard disk drives, optical drives, solid-state memories, etc. The modules may alternatively be embodied partly or wholly in specialized computer hardware, such as ASIC or FPGA circuitry.

It will be clear to one having skill in the art that further variations to the specific details disclosed herein can be made, resulting in other embodiments that are within the scope of the invention disclosed. Steps in the flowcharts may be performed in a different order, other steps may be added, or one or more steps may be removed without altering the main function of the system. Steps may be made to occur in parallel. Flowcharts from different figures may be combined in different ways. Modules may be divided into constituent modules or combined into larger modules. All parameters, factors, thresholds and configurations described herein are examples only and actual values of such depend on the specific embodiment. Accordingly, the scope of the invention is to be construed in accordance with the substance defined by the following claims.

The invention claimed is:

1. A method for determining a state of health (SoH) of a battery, comprising:
connecting the battery to a tester comprising a user interface, a voltage sensor, a load and a processor;
receiving, in the tester via the user interface, a nominal or maximum cut-off voltage of the battery;
receiving, in the tester via the user interface, a capacity of the battery;
measuring, by the voltage sensor of the tester, an initial OCV (open circuit voltage) V1 of the battery;
drawing, by the load, a pulse of current from the battery to the tester, said pulse having an amplitude that is normalized to the capacity;
measuring, by the processor, a voltage response of the battery to the pulse;
selecting, from a plurality of OCV regions, by the processor, an OCV region that V1 lies in, wherein each OCV region has an associated, different set of thresholds, and each OCV region corresponds to a different initial state of charge range for the battery;
adjusting, by the processor, the voltage response using the nominal or maximum cut-off voltage and using the selected OCV region;

comparing, by the processor, said adjusted response to at least one of the thresholds associated with the selected OCV region; and determining, by the processor using said comparison, whether the SoH is above or below a predefined cut-off value.

2. The method of claim 1, wherein:
the voltage response is processed into a plurality of parameters;
the voltage response is adjusted by adjusting the parameters; and
said comparison is performed by comparing the adjusted parameters to said at least one of the thresholds.

3. The method of claim 2, wherein the parameters comprise:
a first parameter P1 defined by subtracting from V1 a voltage V4 measured at the end of a recovery period that follows the pulse;
a second parameter P2 defined by subtracting a voltage V3 measured at the beginning of the recovery period from a voltage V2 measured at the end of the pulse; and
a third parameter P3 defined by subtracting V2 from V1.

4. The method of claim 3, wherein:
the SoH is good if the SoH is above the cut-off value and poor if the SoH is below the cut-off value;
there are three OCV regions;
if V1 is above a first value, a first OCV region is selected;
if V2 is not above the first value but V2 is above a second value, a second OCV region is selected;
if V2 is not above the second value, the third OCV region is selected;
if the first OCV region is selected:
  if P1 is below a first threshold, the SoH is good;
  if P1 is above a second threshold that is higher than the first threshold, the SoH is poor; and
  if P1 is between the first and second thresholds, then if P2 is greater than a third threshold and P3 is less than a fourth threshold, the SoH is good, otherwise the SoH is poor;
if the second OCV region is selected:
  if P3 is less than a fifth threshold, the SoH is good;
  if P3 is greater than a sixth threshold that is greater than the fifth threshold, the SoH is poor; and
  if P3 is between the fifth and sixth thresholds and P2 is greater than a seventh threshold, then the SoH is good, otherwise the SoH is poor; and
if the third OCV region is selected:
  if P3 is less than a eighth threshold, the SoH is good;
  if P3 is greater than a ninth threshold that is greater than the eight threshold, the SoH is poor; and
  if P3 is between the eight and ninth thresholds and P2 is greater than a tenth threshold, then the SoH is good, otherwise the SoH is poor.

5. The method of claim 1, wherein the pulse is followed by a recovery period during which no current is drawn from the battery and the voltage response is measured, and which has a duration long enough for a rate of change of the voltage response to fall below 0.1 mV/s.

6. The method of claim 1, wherein the pulse is a square pulse and the magnitude of the pulse is proportional to the capacity.

7. The method of claim 1, wherein there are three OCV regions, each corresponding to a different initial state of charge range for the battery.

8. The method of claim 1, wherein measuring the voltage response comprises measuring:
a voltage V2 measured at the end of the pulse;
a voltage V3 measured at the beginning of a recovery period that follows the pulse; and
a voltage V4 measured at the end of the recovery period.

9. The method of claim 8 wherein V1 is measured within one second before the pulse.

10. The method of claim 8, wherein:
V2 is measured within a last second of the pulse;
V3 is measured within one second after the pulse; and
V4 is measured within a last second of the recovery period.

11. The method of claim 8, wherein the pulse has a duration of 1 minute and the recovery period has a duration of 3 minutes.

12. The method of claim 1, wherein the pulse is sinusoidal.

13. The method of claim 12, wherein:
the voltage response is measured in a frequency domain;
at least one parameter is calculated from the response that relates to a resistive response of the battery;
at least one further parameter is calculated from the response that relates to a reactive response of the battery.

14. The method of claim 1, further comprising normalizing the response to a temperature of the battery.

15. The method of claim 1, wherein said comparison is performed by an inference system or a neural network.

16. The method of claim 1, further comprising receiving, by the tester, an input that specifies the cut-off value, wherein each set of thresholds has values that depend on the specified cut-off value.

17. The method of claim 1, wherein the tester outputs to the user interface an indication that the battery is:
good if the SoH is above the cut-off value; or
poor if the SoH is below the cut-off value.

18. A device for determining state of health (SoH) of a battery, comprising:
a connection to a battery to be tested;
a user interface configured to receive a nominal or maximum cut-off voltage of the battery and a capacity of the battery;
a voltage sensor to detect an initial OCV (open circuit voltage) V1 of the battery;
a load configured to draw a pulse of current from the battery, said pulse having an amplitude that is normalized to the capacity; and
a processor configured to:
  obtain a voltage response of the battery to the pulse;
  select, from a plurality of OCV regions, an OCV region that V1 lies in, wherein each OCV region has an associated, different set of thresholds, and each OCV region corresponds to a different initial state of charge range for the battery;
  adjust the voltage response using the nominal or maximum cut-off voltage and using the selected OCV region;
  compare said adjusted response to at least one of the thresholds associated with the selected OCV region; and
  determine, using said comparison, whether the SoH is above or below a predefined cut-off value.

19. The device of claim 18, wherein:
the amplitude of the pulse is proportional to the capacity;
the pulse is a square pulse followed by a recovery period during which no current is drawn from the battery and the voltage response is measured;
there are three OCV regions;
the voltage response is processed into:

a first parameter defined by subtracting from V1 a voltage V4 measured at the end of a recovery period that follows the pulse;

a second parameter defined by subtracting a voltage V3 measured at the beginning of the recovery period from a voltage V2 measured at the end of the pulse; and a third parameter defined by subtracting V2 from V1;

the voltage response is adjusted by adjusting the parameters; and said comparison is performed by comparing the adjusted parameters to said at least one of the thresholds.

20. The device of claim 18, wherein the processor is further configured to output to the user interface an indication that the SoH is:

good if the SoH is above the cut-off value; or poor if the SoH is below the cut-off value.

* * * * *